United States Patent [19]

Dusheck, Jr.

[11] 4,277,700
[45] Jul. 7, 1981

[54] OUTPUT ONE-SHOT

[75] Inventor: George J. Dusheck, Jr., Cinnaminson, N.J.

[73] Assignee: The United States of America as represented by the Secretary of the Navy, Washington, D.C.

[21] Appl. No.: 788,811

[22] Filed: Jan. 3, 1969

[51] Int. Cl.³ .................. H03K 3/033; H03K 3/284
[52] U.S. Cl. ...................................... 307/273; 328/207
[58] Field of Search ..................... 307/273; 328/207

[56] References Cited
U.S. PATENT DOCUMENTS
3,184,604  5/1965  Hale .................................. 307/273 X

*Primary Examiner*—Malcolm F. Hubler
*Attorney, Agent, or Firm*—Edgar J. Brower; Henry Hansen

[57] ABSTRACT

An output one-shot including a monostable multivibrator having a source of positive voltage connected through a network of inductive, resistive and capacitive elements. A transistor receiving a power source through a decoupling network is connected to the network and the monostable multivibrator for providing increased stability to the system.

7 Claims, 1 Drawing Figure

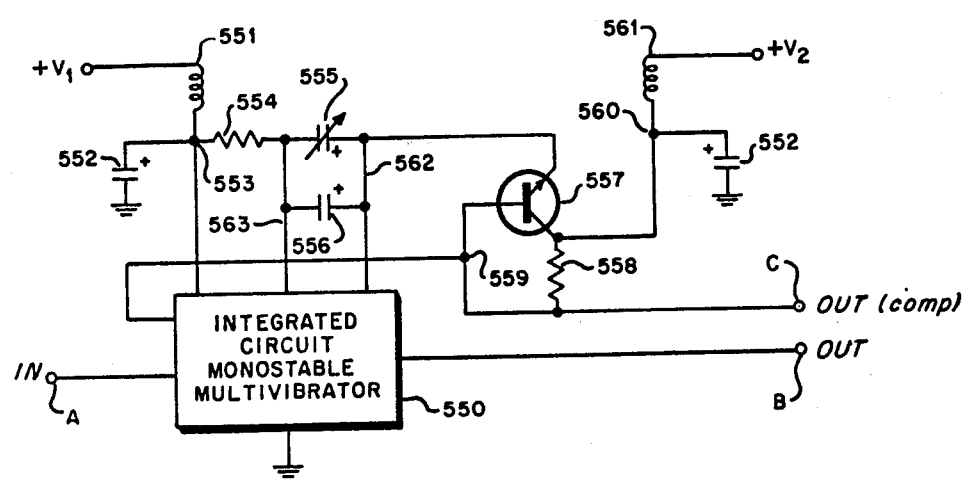

OUTPUT ONE-SHOT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to an output one-shot for use in a feature recognition system which processes transient submarine signals occurring in the presence of signal-like noise and which further recognizes certain relatively invariant features exhibited by the submarine signals and not by the noise signals.

In the field of submarine detection and recognition, magnetic anomaly detection (MAD) devices and techniques have long been utilized. Basically, MAD is an airborne system employing magnetometer elements which sense the presence of a submerged submarine by measuring the small distortion in the earth's magnetic field caused thereby. This technique is an exacting one as the earth's magnetic field intensity may be on the order of 10,000 times stronger than that of the submarine. Additionally, the high altitudes of the aircraft, or more exactly the long slant ranges to the submarine, cause the signals from the submarine to virtually disappear into the noise background. This noise is derived from a multiplicity of sources as from, for example, the magnetometer sensing element itself, the magnetic and electrical equipments of the aircraft, large magnetic fields external to the aircraft such as geologic mineral deposits beneath the ocean floor, and other phenomena.

Due to these many noise sources and the distance between sensor and submarine, the submarine signal is either completely disguised by the noise such that it cannot be recognized therefrom or the noise signals themselves produce a response similar to the submarine signals such that false recognitions are effectuated.

Prior art systems incorporated a trained human operator who memorized features or patterns known to be representative of the signature of a submarine and whose function it was to visually recognize and extract these submarine signals from data displayed before him. The accuracy of such a technique was relatively low and varied with the individual operator. In addition, all of the operators fatigued with time thus further decreasing accuracy. The result was that many false alarms were indicated and many actual targets were entirely missed.

Thus there arose a need for a system capable of automatically and electronically recognizing and detecting, with a high degree of accuracy and reliability, submarine signals occurring in the presence of signal-like noise.

SUMMARY OF THE INVENTION

Accordingly, it is the general purpose of the present invention to provide an output one-shot for use in a feature recognition system which fulfills the need for a highly accurate, fully automatic submarine detection system. The recognition system operates upon incoming MAD signals containing both submarine signals and signal-like noise, by abstracting the primary feature or positive and negative slopes thereof, and by utilizing and processing these primary features to recognize and detect relatively invariant submarine signals therefrom.

The recognition system is divided into two major functional areas, the preprocessor system and the processor or signal recognition and detection system. The output one-shot is utilized in the processor. The preprocessor receives MAD amplitude-time domain information (i.e., varying amplitude signals in the time domain) and passes them through a plurality of filter channels each having a different bandwith and center frequency to provide time waveforms in the amplitude-time-frequency domain (i.e., signals varying in both amplitude and frequency but having the same time base as the received MAD signals). Thereafter, the preprocessor both preparies the amplitude-time-frequency domain primary signals for (slope) feature abstraction and actually performs the feature abstraction operation. The processor receives the primary feature abstracted signals and detects and recognizes therefrom the relative presence of invariant submarine signals or features as a function of degree of probability of detection and slant range from airborne feature recognition system to submerged submarine.

The processor comprises a plurality of recognition logic networks, each network including a range of logic circuits and each logic circuit per range being representative of a particular probability of detection as determined from empirical data, test results, and analysis. After the information is processed, if it satisfies the particular range criteria for the particular probability of detection for the range it is displayed thereby indicating a detected target (i.e., a submarine) with a degree of certainty equal to the degree of probability for the range.

The output one-shot (OOS) indicates the decisions from the recognition logic. The OOS includes an integrated circuit monostable multivibrator having a source of positive voltage connected thereto through an inductor and a network of resistive-capacitive elements. One of the capacitors is variable. A transistor is connected at its base and emitter contacts to this network while the collector is connected through a network of inductive-capacitive elements to a second source of positive voltage. The transistor provides increased stability at high duty cycles of OOS operation.

When the OOS receives a signal from the recognition logic it provides an output pulse the duration of which is determined by the aforementioned resistive-capacitive elements and more particularly by the variable capacitor therein. These different durations serve to identify the particular ranges of information being operated upon by both the preprocessor and the processor. Thus a pulse duration of a first preset time indicates that a first particular set of information has been processed while a pulse duration of a second, different, present time indicates that a second particular set of information has been processed, and so on.

BRIEF DESCRIPTION OF THE DRAWING

The FIGURE is a schematic diagram of an output one-shot.

DESCRIPTION OF THE PREFERRED EMBODIMENT

Referring now to the FIGURE output one-shot will now be described. The output one-shot comprises a monolithic, silicon epitaxial, integrated circuit, monostable multivibrator of the type such as, for example, manufactured by Fairchild Semiconductor Corporation commercially available under the part number VTμL951. The output one-shot with its integrated circuit monostable multivibrator 550 is used to indicate decisions from the recognition logic. A source of supply $+V_1$ is connected through an inductor 551 to one of the inputs of the monostable multivibrator 550. The other side of the inductor 551 is also connected at the point 553 to the plus side of a grounded polarized capacitor 552 and further connected to one side of a resistor 554. The other side of resistor 554 is connected to the negative ends of two paralleled, polarized capacitors 555 and 556, these capacitors being connected across a second and a third input of the monostable multivibrator 550.

The period of the output one-shot (duration of the output pulse thereof) is determined by the time constant of resistor 554 and the two paralleled capacitors 555 and 556. For each range recognition logic a different period is utilized to identify the range. This is accomplished by varying capacitor 555 to achieve time constants of 1.0, 1.5, 2.0, and 2.5 seconds, corresponding, respectively, to ranges 1, 2, 3, and 4.

Connected to the positive terminal of the capacitors 555 and 556 is the emitter of a transistor 557, the base of which is connected to a fourth input of multivibrator 550, and the collector of which is connected through a resistor 558 to the complementary output of the output one-shot. The base of the transistor is also connected at the point 559 to the complementary output of the output one-shot. Connected to the collector of transistor 557 at the point 560 and through an inductor 561 is a second source of voltage $+V_2$. Also connected to the point 560 is the positive terminal of a second grounded capacitor 552. In general, the magnitude of $V_2$ should be greater than that of $V_1$. The signal input to the output one-shot is taken at point A (as shown) and the two outputs (actually the output and its complement) are taken at the points B and C, also as shown.

Operationally, when the input signal to the output one-shot at the point A goes low, the OOS period begins. The period of the OOS is determined by the time required to charge capacitors 555 and 556 through the resistor 554. When the period begins transistor 557 is kept off since the complementary output applied to its base back biases the emitter-base junction. Therefore, the charging path of the capacitor 555 is into the monostable multivibrator 550 through the line 562. However, at the end of the period, capacitor 555 must be discharged before a second period can be timed or the second period will be effected by the remaining charge on the capacitor 555. Accordingly, at the end of a period, when the complementary output goes low this turns on the transistor 557 by forward biasing the emitter-base junction. When this occurs, the capacitor 555 will discharge rapidly to ground through the path determined by the transistor 557, the capacitor 552 and to a grounded terminal within the monostable multivibrator through the line 563.

It should thus be seen that the transistor 557 is added to increase the OOS's period stability at high duty cycles. The multivibrator by itself only permits a 50% duty cycle for a 3% change in period. The OOS with the charging transistor permits up to a 96% duty cycle with only a 3% change in period. This allows rapid discharge of the capacitor 555 so that it is free to accept charge and thereby time a second period, the charge from the first period no longer having effect on the circuit performance.

Obviously many modifications and variations of the present invention are possible in the light of the above teachings. It is therefore to be understood that within the scope of the appended claims the invention may be practiced otherwise than as specifically described.

What is claimed is:

1. A logic circuit providing a digital output signal for selectable time periods comprising:
   monostable multivibrator means for receiving a digital input signal and for providing an output pulse in response to said received digital signal;
   first means operatively connected to said multivibrator means for controlling the duration of said pulse;
   second means operatively connected to said first means and multivibrator means for providing changes in impedance in response to received signals;
   a first positive voltage source;
   a second positive voltage source;
   a first decoupling network operatively connected to said first voltage source and said first means; and
   a second decoupling network operatively connected to said second voltage source and said second means.

2. A logic circuit providing a digital output signal for selectable time periods according to claim 1 wherein said first and second decoupling networks comprise:
   a first and second inductor connected respectively to said first and second voltage sources; and
   a first and second capacitor each grounded at one end thereof and each connected at its respective other end to said first inductor and said second inductor thereby forming two junctions.

3. A logic circuit providing a digital output signal for selectable time periods according to claim 2 wherein said first means comprises:
   a first resistor connected at one end thereof to the junction formed by said first inductor and said first capacitor; and
   a paralleled capacitor connected to the other end of said first resistor and to said monostable multivibrator means.

4. A logic circuit providing a digital output signal for selectable time periods according to claim 3 wherein:
   said paralleled capacitor includes at least one variable capacitor for varying the duration of said pulse produced by said monostable multivibrator means.

5. A logic circuit providing a digital output signal for selectable time periods according to claim 4 wherein said second means comprises:
   a transistor having emitter, base, and collector electrodes, said emitter electrode connected to said parallel capacitor, said base electrode to an input terminal of said monostable multivibrator means, and said collector electrode connected to the junction formed by said second inductor and said second capacitor.

6. A logic circuit providing a digital output signal for selectable time periods according to claim 5 wherein said second means further comprises:
   a second resistor connected at one end thereof to the collector of said transistor and at the other end thereof to the base of said transistor.

7. A logic circuit providing a digital output signal for selectable time periods according to claim 6 wherein:
   said first and said second voltage sources provide first and second positive voltages, respectively, the magnitude of said second voltage being greater than that of said first voltage; and
   said monostable multivibrator means provides both said output pulse and the complement thereof, said complementary pulse being taken at the common junction of said second resistor and said base of said transistor.

* * * * *